US008849466B2

(12) United States Patent
Ding

(10) Patent No.: US 8,849,466 B2
(45) Date of Patent: Sep. 30, 2014

(54) METHOD OF AND APPARATUS FOR MULTIPLE CHANNEL FLOW RATIO CONTROLLER SYSTEM

(75) Inventor: Junhua Ding, Boxborough, MA (US)

(73) Assignee: MKS Instruments, Inc., Andover, MA (US)

( * ) Notice: Subject to any disclaimer, the term of this patent is extended or adjusted under 35 U.S.C. 154(b) by 394 days.

(21) Appl. No.: 13/252,363

(22) Filed: Oct. 4, 2011

(65) Prior Publication Data
US 2013/0085618 A1 Apr. 4, 2013

(51) Int. Cl.
G05D 11/13 (2006.01)
(52) U.S. Cl.
USPC .................. 700/282; 137/101; 137/101.19
(58) Field of Classification Search
USPC ............... 700/282; 137/101, 101.19, 487.5
See application file for complete search history.

(56) References Cited

U.S. PATENT DOCUMENTS

| 4,369,031 | A | 1/1983 | Goldman et al. |
| 5,453,124 | A | 9/1995 | Moslehi et al. |
| 6,333,272 | B1 | 12/2001 | McMillin et al. |
| 6,418,954 | B1 | 7/2002 | Taylor et al. |
| 6,418,994 | B1 | 7/2002 | Arnaud et al. |
| 6,766,260 | B2 | 7/2004 | Ambrosina et al. |
| 6,792,166 | B1 | 9/2004 | Xu et al. |
| 6,941,965 | B2 | 9/2005 | Lull et al. |
| 7,007,707 | B2 | 3/2006 | Ambrosina et al. |
| 7,072,743 | B2 | 7/2006 | Shajii et al. |
| 7,143,774 | B2 | 12/2006 | Lull et al. |
| 7,360,551 | B2 | 4/2008 | Lull et al. |
| 7,424,894 | B2 | 9/2008 | Lull et al. |
| 7,621,290 | B2 * | 11/2009 | Ding et al. .................. 137/9 |
| 7,673,645 | B2 * | 3/2010 | Ding et al. .................. 137/9 |
| 2002/0038669 | A1 | 4/2002 | Yamagishi et al. |
| 2004/0168719 | A1 | 9/2004 | Nambu |
| 2006/0237063 | A1 * | 10/2006 | Ding et al. ............. 137/487.5 |
| 2007/0186983 | A1 * | 8/2007 | Ding et al. ............. 137/487.5 |
| 2007/0240778 | A1 | 10/2007 | L'Bassi et al. |

OTHER PUBLICATIONS

International Search Report ad the Written Opinion dated Jan. 30, 2013 from PCT Application No. PCT/US2012/057799.

* cited by examiner

Primary Examiner — Charles Kasenge
(74) Attorney, Agent, or Firm — McDermott Will & Emery LLP

(57) ABSTRACT

A four channel gas delivery system comprising: an inlet channel; four outlet channels; four flow sensors; four control valves, each valve being arranged so as to control the flow from the inlet channel through a corresponding one of the outlet channels; a flow ratio control system configured so as to control the flow from the inlet channel through the corresponding outlet channels so that the following flow ratios are controlled: (a) a first ratio of flows between the outlet channels of a first pair; (b) a second ratio of flows between the outlet channels of a second pair; and (c) a third ratio of flows between the first pair of outlet channels relative to the second pair of outlet channels; wherein the third ratio is controlled by generating at least one bias signal respectively applied to at least one pair of valves, the bias signal being a function of a predetermined set point of the third ratio and measured values of the third ratio.

52 Claims, 7 Drawing Sheets

METHOD OF AND APPARATUS FOR MULTIPLE CHANNEL FLOW RATIO CONTROLLER SYSTEM

RELATED PATENTS

This application relates to U.S. Pat. No. 6,766,260, filed Jan. 4, 2002; U.S. Pat. No. 7,072,743, filed Mar. 9, 2004; U.S. Pat. No. 7,621,290, filed Apr. 21, 2005; and U.S. Pat. No. 7,673,645, filed Feb. 20, 2007, the disclosures of which are incorporated herein by reference in their entirety.

BACKGROUND

1. Field

The present disclosure relates generally to semiconductor processing equipment and, more particularly to a flow ratio controller for delivering contaminant-free, precisely metered quantities of process gases in predetermined ratios to at least two locations of a process tool or tools. More particularly, the present disclosure relates to a system for and method of dividing flow from a single gas box in predetermined ratios to four locations of a process tool or tools with antisymmetric optimal performance.

2. Background

As used herein the term "gas(es)" includes the term "vapor(s)" should the two terms be considered different.

The fabrication of semiconductor devices often requires the careful synchronization and precisely measured delivery of as many as a dozen gases to a process tool, such as a vacuum chamber. Various recipes are used in the fabrication process, and many discrete processing steps can be required, where for example a semiconductor device is cleaned, polished, oxidized, masked, etched, doped, or metalized. The steps used, their particular sequence and the materials involved all contribute to the making of particular devices.

Accordingly, wafer fabrication facilities are commonly organized to include areas in which chemical vapor deposition, plasma deposition, plasma etching, sputtering and other similar gas manufacturing processes are carried out. The process tools, be they chemical vapor deposition reactors, vacuum sputtering machines, plasma etchers or plasma enhanced chemical vapor deposition chambers, or any other device, apparatus or system, must be supplied with various process gases. Pure gases must be supplied to the tools in contaminant-free, precisely metered quantities.

In a typical wafer fabrication facility the gases are stored in tanks connected via piping or conduit to a gas delivery system. The gas delivery system includes a gas box for delivering contaminant-free, precisely metered quantities of pure inert or reactant gases from the tanks of the fabrication facility to a process tool and/or chamber. The gas box typically includes a plurality of gas flow lines each having a flow metering unit, which in turn can include valves, pressure regulators and transducers, mass flow controllers, filters/purifiers and the like. Each gas line has its own inlet for connection to a separate source of gas, but all of the gas paths converge into a single outlet of the gas box for connection to the process tool.

Sometimes it is desirable to divide or split the combined process gases provided at the outlet of a gas box so that they can be delivered to multiple locations of a single process tool or among multiple process tools. In such cases, the single outlet of the gas box is connected to the multiple locations through secondary flow lines or channels. In some applications, where, for example, the upstream pressure needs to be kept lower than atmospheric pressure (e.g., kept below 15 PSIA) for safety or other reasons, a flow ratio controller is used to insure that the primary flow of the outlet of the gas box is divided in accordance with a preselected ratio among the secondary flow paths or channels.

Flow ratio controller systems of the type shown in U.S. Pat. No. 6,766,260 will stabilize to the desirable ratio split after being initially set, but flows take time to stabilize, and in some applications this can be unsatisfactory. Further, the pressure drop across the valves of the flow ratio controller system can be significantly high. Also, the controller system provides poor control performance for handling downstream blocking of one of the secondary flow paths. Additionally, the system can be difficult to set up because of difficulties in initially determining fixed valve positions of the valves in the secondary flow lines. And for current embodiments using two secondary flow lines it is necessary to assign the high flow valve as the fixed valve and the low flow valve as the controlled valve for flow ratio control.

One application for a flow ratio controller system is to control the flow of gas to a "shower head", a fixture used in the process chamber of a process tool for making semiconductor devices, such as described in U.S. Pat. No. 7,072,743. Shower head fixtures each include two gas outlets, one from opening(s) provided in the center (or inner portion) of the fixture, and one from opening(s) provided around the periphery (or outer portion) of the fixture. Flow through opening(s) in the outer portion of a shower head fixture affects the outer portion or zone of a wafer being created in the chamber, while the flow through the opening(s) in the inner portion affects the inner portion or zone of the wafer being created. Greater flow to the outer zone than the inner zone is desirable to provide an even application of gas to the wafer being processed. Thus, carefully controlling the ratio of the gas flow provided from the inner portion relative to the gas flow to the outer portion results in the even application of gas to the wafer.

An improved flow ratio controller system, referred to as a two channel or DAO flow ratio controller system, is described in U.S. Pat. No. 7,621,290, assigned to the present assignee. The embodiment described in the patent utilizes a dual antisymmetric optimal (DAO) control algorithm for dividing a single mass into two flow lines. Each flow line includes a flow meter and a valve. Both valves of the flow ratio controller system are controlled through a ratio feedback loop by a DAO controller. The latter includes a single input, single output (SISO) controller, an inverter and two linear saturators. The output of the SISO controller is split and modified before being applied to the two valves. The two valve control commands are virtually antisymmetric to the maximum allowable valve conductance position as one of the two saturation limits. This means that one of the valves is kept at its maximum allowable valve conductance (opened) position at any moment of time while the other is actively controlled to maintain the flow ratio. This results in the DAO flow ratio controller contributing the minimum pressure drop to the gas flow. One application for the DAO flow ratio controller system is controlling the flow ratio to each of the inner and outer openings of a shower head fixture relative to the total flow through both.

Current production of wafers can include identical wafers being simultaneously manufactured in separate chambers, with the process for each chamber being identical. The sequence and flow rate of gases flowing into each chamber will therefore be identical, and thus there would be savings to use an integrated control system including a single gas box that controls the same ratio of gases with each step of the process to each of the chambers. With a single gas box used to provide gases to two chambers, considerable savings, and a smaller footprint is needed for the equipment. Further, with advances, the size of wafers are getting larger requiring more than one shower head fixture to be used in order to insure the gas flow over the entire wafer is properly controlled. However, there is a challenge to ensure that the proper flow ratio is maintained during each step of the process.

One flow ratio controller system for controlling the ratio of the flow of gases through more than two flow lines is described in U.S. Pat. No. 7,673,645. The flow ratio controller utilizes a multiple antisymmetric optimal (MAO) algorithm for dividing a single mass flow into multiple (more than two) flow lines. Each flow line is provided with a SISO feedback controller combined with a linear saturator to achieve the targeted flow ratio set point. Each valve control command is antisymmetric to the summation of all of the other valve control commands so that the MAO control algorithm guarantees that there exists at least one valve at the allowable maximum open position at any moment so that the optimal solution in terms of the maximum total valve conductance for a given set of flow ratio set points is achieved. This approach provides excellent control with minimum pressure drop through each flow line, and can satisfactorily be used for most applications. However, in the example where it is desirable that the ratio of the rate of flow to the inner openings of two shower head fixtures are substantially the same and the ratio of the rate of flow to the outer openings of the two fixtures are substantially the same, all relative to the total rate of flow into the fixtures, the control functions for the flow lines do not necessarily settle with precisely the same response time with each change in flow occurring though the flow lines, resulting in imprecise control.

One approach to providing the same ratio to the inner and outer openings of two shower head fixtures is shown in FIG. 1. The hardware system includes three two channel flow ratio controller units 10A, 10B and 10C, each of the type described U.S. Pat. No. 7,621,290, arranged in two stages. The first stage includes one unit 10A that receives the total flow at a rate of Qt from a gas box or other source, and initially divides the total flow at rate Qt into two flows at rates Qa and Qb (where Qt=Qa+Qb) in accordance with a ratio set by the host controller 12. The second stage includes two controller units 10B and 10C. Unit 10B receives the total flow at a rate of Qa from controller unit 10A, and divides the total flow at rate Qa into two flows at rates Q1 and Q2 (where Qa=Q1+Q2) in accordance with a ratio set by the host controller 12. Similarly, unit 10C receives the total flow at a rate of Qb from controller unit 10A, and divides the total flow at rate Qb into two flows at rates Q3 and Q4 (where Qb=Q3+Q4) in accordance with a ratio also set by the host controller 12. The two stage control is used to control the flow of gas to two shower head fixtures (not shown) both at the same ratio so that the Qa=Qb, Q1+Q2=Q3+Q4, and the ratio Q1/(Q1+Q2)=Q3/(Q3+Q4). This result in the ratio of flow to the inner and outer portions of each shower head fixture being the same. Each controller unit 10 includes it's own controller 14 for controlling the valves 16 in response to the corresponding sensor signals generated by the flow sensors 18 so as to maintain the programmed ratio provided by the host controller 12. Host controller 12 thus must be used to coordinate the three hardware units 10. While the arrangement works, there is an increase in pressure drop and a reduction in the optimal valve conductance along each flow path because of the two stage approach.

Accordingly, it is desirable to provide a flow ratio controller system that provides relative flow rates through four flow lines with minimum pressure drop through each flow line, with antisymmetrical optimal control, and with substantially the same response times for all of the flow lines.

DESCRIPTION OF RELATED ART

Specific reference is made to U.S. Pat. Nos. 4,369,031; 5,453,124; 6,333,272; 6,418,954; 6,418,994; 6,766,260; 6,792,166; 6,941,965; 7,007,707; 7,072,743; 7,143,774; 7,360,551; (U.S. Pub. App. 2006/0272703); U.S. Pat. Nos. 7,360,551; 7,424,894; 7,621,290; 7,6736,45; U.S. Published Application Nos. 2002/0038669; 2006/0272703; and 2007/0240778.

SUMMARY

In accordance with one aspect of teachings described herein, a four channel gas delivery system, comprises: an inlet channel; four outlet channels; four flow sensors; four control valves, wherein each valve is arranged so as to control the flow from the inlet channel through a corresponding one of the outlet channels. The gas delivery system also includes a flow ratio control system configured so as to control the flow from the inlet channel through the corresponding outlet channels so that the following flow ratios are controlled: (a) a first ratio of flows between the outlet channels of a first pair; (b) a second ratio of flows between the outlet channels of a second pair; and (c) a third ratio of flows between the first pair of outlet channels relative to the second pair of outlet channels; wherein the third ratio is controlled by generating at least one bias signal respectively applied to at least one pair of valves, the bias signal being a function of a predetermined set point of the third ratio and measured values of the third ratio.

In accordance with another aspect of the teachings described herein, a four channel gas delivery system comprising: an inlet channel; four outlet channels and four control valves. Each valve is arranged so as to control the flow from the inlet channel through a corresponding one of the outlet channels. The gas delivery system also includes a flow ratio control system including two dual asymmetric optimal (DAO) control modules configured and arranged so as to control the respective control valves so as to control the relative ratios of flow from the inlet channel through the four outlet channels, and a virtual DAO control module configured and arranged so as to control the ratio of flow between the two DAO control modules.

In accordance with yet another aspect of the teachings described herein, a four channel gas delivery system for controlling the flow from an inlet channel through four outlet channels, comprises: a flow ratio control system including two dual asymmetric optimal (DAO) control modules configured and arranged so as to control the relative ratios of flow from the inlet channel through the four outlet channels, and a bias control signal generator configured and arranged so as generate bias control signal for each of the two DAO control modules as a function of the ratio of flow through the two DAO control modules.

In accordance with still another aspect of the teachings described herein, a multi-channel gas delivery system for controlling the flow from an inlet channel through four outlet channels comprises: a flow ratio control system including two dual asymmetric optimal (DAO) control modules configured and arranged so as to control the relative ratios of flow from the inlet channel through the four outlet channels, and a signal generator configured and arranged so as generate a control signal for each of the two DAO control modules as a function of the ratio of flow through the two DAO control modules.

In accordance with yet another aspect of the teachings described herein, a method of controlling four control valves so as to control the relative ratios of flow from an inlet channel through four outlet channels using two dual asymmetric optimal (DAO) control modules; comprises: generating a bias control signal for each of the two DAO control modules as a function of the ratio of flow through the two DAO control modules.

In accordance with yet another aspect of the teachings described herein, a method is provided for controlling four control valves so as to control the relative ratios of flow from an inlet channel through four outlet channels using two dual asymmetric optimal (DAO) control module. The method comprises: generating a bias control signal for each of the two DAO control modules as a function of the ratio of flow through the two DAO control modules.

These, as well as other components, steps, features, objects, benefits, and advantages, will now become clear from a review of the following detailed description of illustrative embodiments, the accompanying drawings, and the claims.

BRIEF DESCRIPTION OF DRAWING

The drawings disclose illustrative embodiments. They do not set forth all embodiments. Other embodiments may be used in addition or instead. Details which may be apparent or unnecessary may be omitted to save space or for more effective illustration. Conversely, some embodiments may be practiced without all of the details which are disclosed. In the drawings.

DETAILED DESCRIPTION OF ILLUSTRATIVE EMBODIMENTS

Illustrative embodiments are now discussed. Other embodiments may be used in addition or instead. Details which may be apparent or unnecessary may be omitted to save space or for a more effective presentation. Conversely, some embodiments may be practiced without all of the details which are disclosed.

Figure 2:
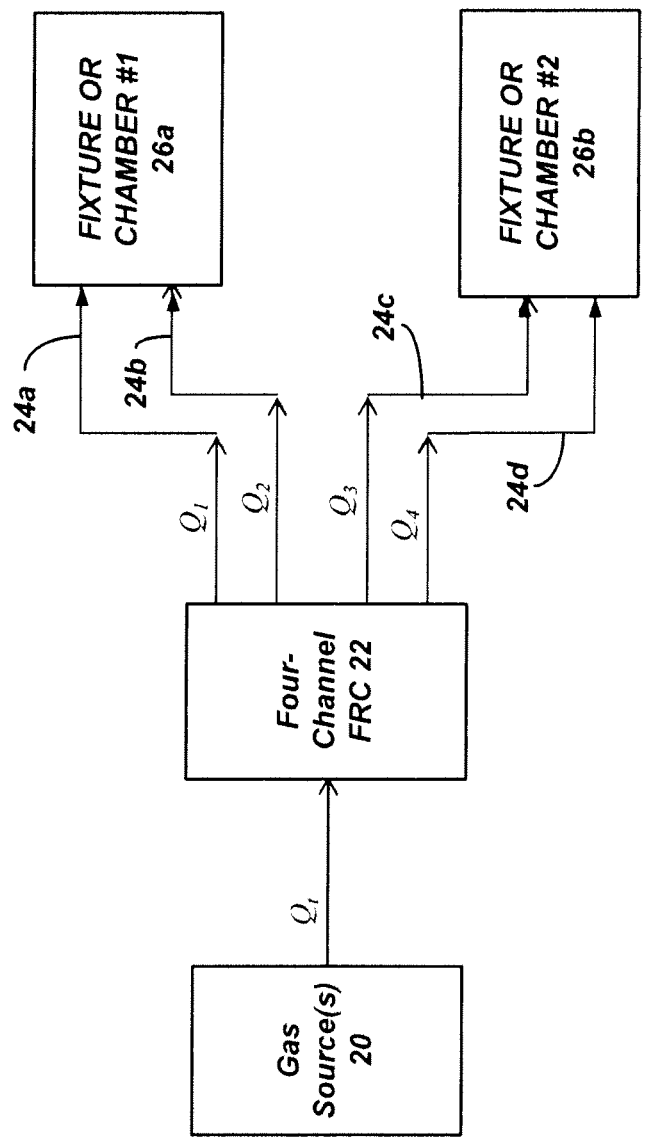
FIG. 2 is a block diagram of one embodiment of a gas delivery system incorporating teachings described herein.

Referring to FIG. 2, the flow ratio controller (FRC) system 22 receives the flow Qt which is the total flow available from one or more sources 20, and which must be divided among four secondary flow channels 24a, 24b, 24c and 24d. Two of the channels 22a and 22b are coupled to a first fixture such as a shower head fixture 26a (or a pair of fixtures), while the other two channels 22c and 22d are coupled to a second fixture such as a shower head fixture 26b (or a pair of fixtures). The two fixtures 26a and 26b can be disposed in a single chamber, or disposed in separate chambers. FRC system 22 is preferably designed to provide the same flow ratio Q1/(Q1+Q2) as the flow ratio Q3/(Q3+Q4), and same flow ratio Q2/(Q1+Q2) as the flow ratio Q4/(Q3+Q4). Further, in one preferred application the flow rates Q1 and Q3 are substantially the same, and flow rates Q2 and Q4 are substantially the same, with permissible adjustments to accommodate certain system variables such as differences in response times of valves, flow conditions through the channels, etc. Of importance, the control functions for the flow lines settle with substantially same response time with each change in flow though the flow lines, as for example the transition that occurs with the initial flows through the FRC system 22.

Figure 3:
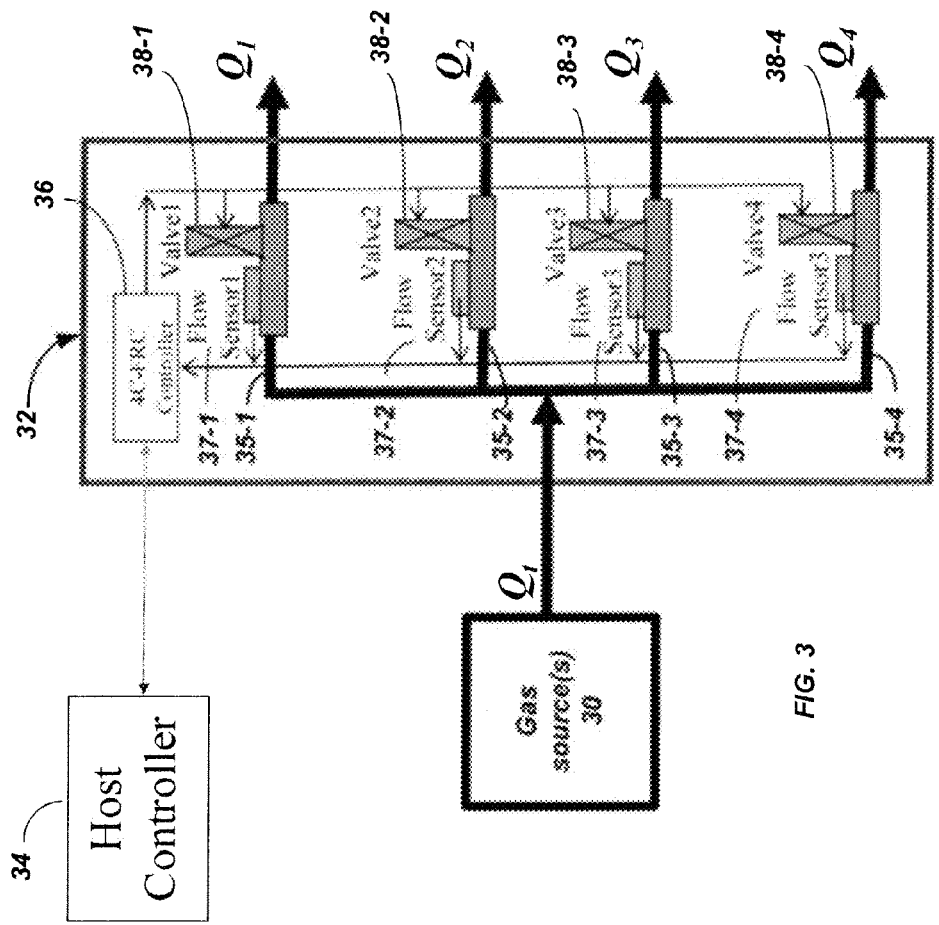
FIG. 3 is a more detailed schematic diagram of one embodiment of a gas delivery system of the type shown in FIG. 2.

Referring to FIG. 3, the flow ratio controller 32 includes four flow paths or lines 35-1, 35-2, 35-3, and 35-4. Each flow path includes a sensor 37 and valve 38. Sensor 37 generates a flow rate signal for use in controlling the respective valve 38 so as to control the mass flow through the corresponding flow path. The sensor and valve of each flow path are thus used together to control the respective output mass flow $Q_1$, $Q_2$, $Q_3$, $Q_4$ the flow path, and thus the flow ratio which is defined as:

$$r_{mi} = Q_i/Q_t, \ i=1,2,3,4 \quad (1)$$

wherein $r_{mi}$ is the flow ratio of line 35-$i$ relative to the total flow, $Q_i$ is the flow through the line 35-$i$, and $Q_t$ is the total flow of all flow lines 35 defined as:

$$Q_t \Sigma Q_i = Q_1 + Q_2 + Q_3 + Q_4 \quad (2)$$

According to Eq. (1) and Eq. (2), the summation of all flow ratios equals one, which can be expressed as $$\Sigma r_{mi} = r_{m1} + r_{m2} + r_{m3} + r_{m4} = 1 \quad (3)$$

Defining the flow ratio setpoint of flow channel i as $r_i$, we have the summation of all flow ratio setpoints equals one as well, i.e., $$\Sigma r_i = r_1 + r_2 + r_3 + r_4 = 1 \quad (4)$$

Figure 1:
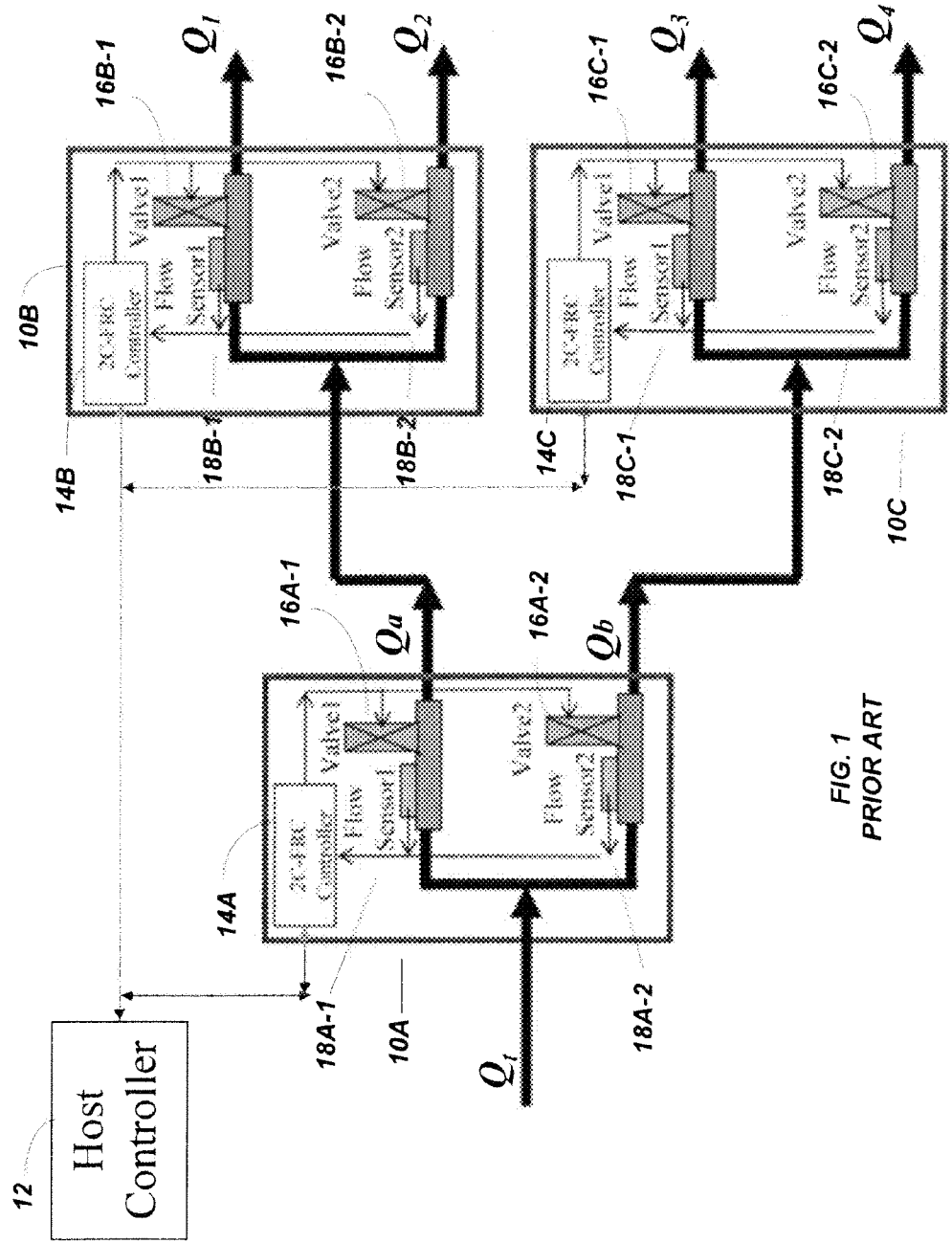
FIG. 1 is a block diagram of a prior art approach of a ratio flow controller system for providing ratio control with respect to four secondary flow lines.

FIG. 3 illustrates one embodiment of a gas delivery system comprising four channel FRC system 32. System 32 receives a gas or mixture of gases from one or more sources indicated at 30, defining the total flow Qt at the inlet to the system 32. System 32 has a dedicated FRC controller 36 configured to control all four valves 38 as a function of the flows sensed by the corresponding flow sensors 37. System 32 is configured to provide the ratio of flows achieved in FIG. 1, but in one stage, with the control functions for the flow lines settling with substantially the same response time with each change in flow occurring though the flow lines. The foregoing is accomplished by employing a first DAO control module for controlling one pair of valves, a second DAO control module for controlling the other pair of valves of the unit 32, and a third DAO control module for providing biased currents to the first and the second DAO control modules. Controller 36 is configured to provide the necessary functionality (preferably in software) to provide a DAO control for controlling the flow ratio between the two pairs of valves.

Figure 4:
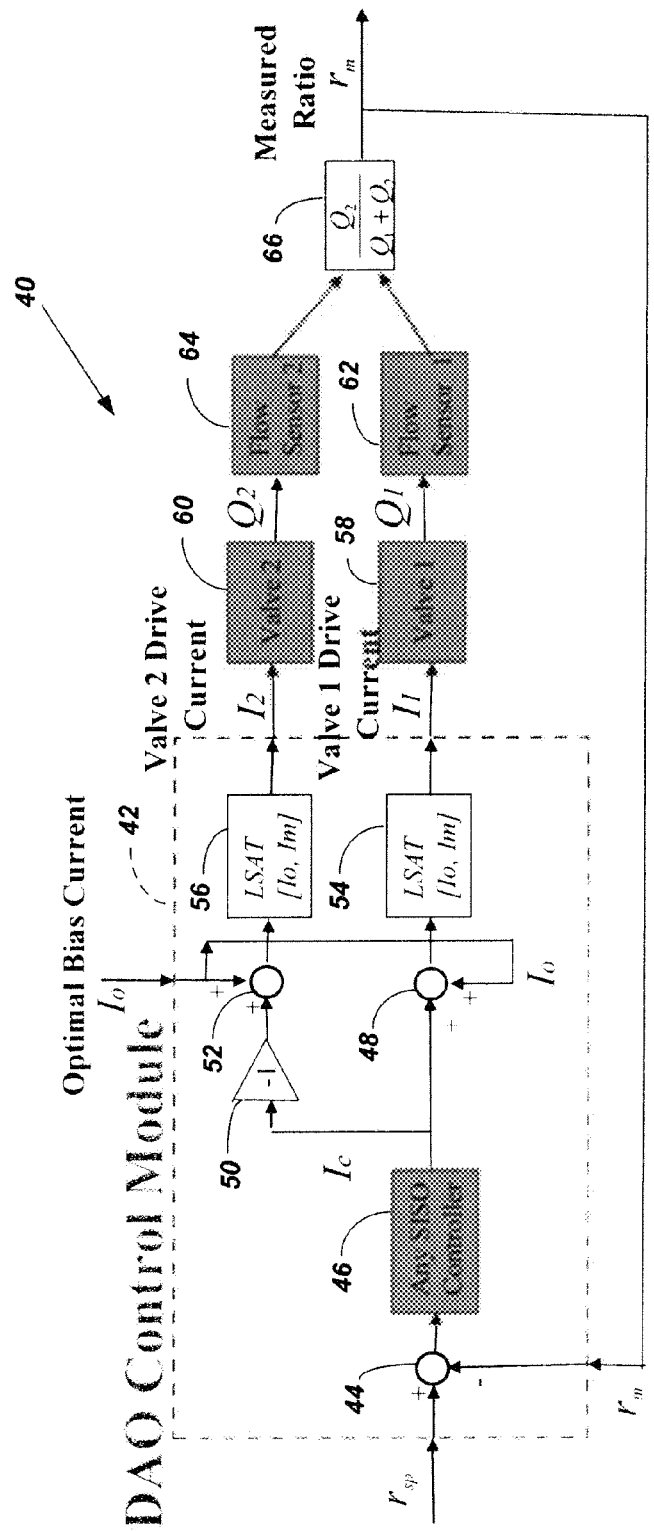
FIG. 4 is a functional block diagram of the preferred dual antisymmetric optimal control algorithm for controlling the ratio of flow through two of the secondary flow lines of the FIG. 3 embodiment, where both valves are controlled with the same bias current, and the two valve control commands of the two valves shown are virtually antisymmetric with respect to the maximum allowable valve conductance.

FIG. 4 illustrates a functional block diagram of one embodiment of a antisymmetric feedback control arrangement for controlling each pair of valves that are controlled by a DAO control module. The feedback control arrangement shown at 40 is used to control a corresponding pair of valves of the system 32 in a manner so that the ratio of r1=Q1/(Q1+

Q2) substantially equals r3=Q3/(Q3+Q4), and r2=Q2/(Q1+Q2) substantially equals r4=Q4/(Q3+Q4). The feedback control system is preferably accomplished in software run on the dedicated FRC controller 36 (of FIG. 3), although the system can be implemented in other forms. The feedback control arrangement includes DAO control module 42. Module 42 includes an input to a summing junction 44 for receiving a signal representative of the set point for the flow ratio $r_{sp}$, and another input for receiving a signal representative of the measured flow ratio $r_m$ of the feed back arrangement. The summing junction 44 of each unit calculates the error signal between the setpoint ratio and the measured ratio input, $r_{sp}$ and $r_m$, and feeds this error signal to an SISO (single input, single output) controller 46, which for example can be a PID controller (although other types of controllers can be used). The output of the controller 46 is connected to a first summing junction 48 and through inverter 50 to a second summing junction 52. The output of controller 46 is a control current $I_c$. The control current is applied to the summing junction 48, and inverted by inverter 50 before being applied to summing junction 52. The fixed bias current input Io is added to the signal $I_c$ at summing junction 48, and added to the inverted signal $(-I_c)$ at the summing junction 52. The summed signals from the summing junctions 48 and 52 are then respectively applied to the corresponding inputs of linear saturators (LSAT) 54 and 56, which in turn are respectively connected to provide the valve control currents I1 and I2. Valve control currents I1 and I2 are applied to corresponding valves 58 and 60 of the pair of valves being controlled. The flow through the valve 58 is measured by the corresponding flow sensor 62. The output of the sensor 62 represents the flow rate Q1 through the valve 58. Similarly, the flow through the valve 60 is measured by the corresponding flow sensor 64. The output of the sensor 64 represents the flow rate Q2 through the valve 60. The two outputs are provided to a ratio measurement block 66 for providing a measurement of the ratio $Q2/(Q_1+Q2)$. This ratio represents the measured ratio $r_m$ provided in the feedback path to the summing junction 44. The output signal $r_m$ is subtracted from the set point $r_{sp}$ at the summing junction 44 as a control feedback arrangement.

Figure 5:
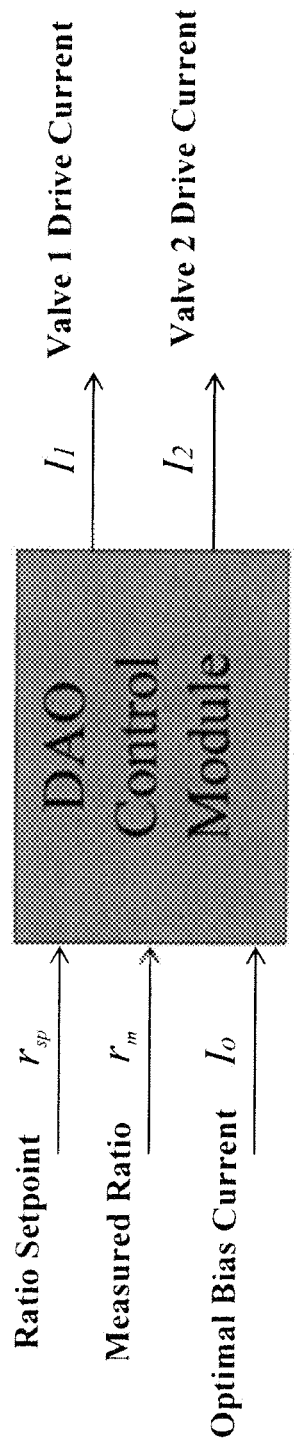
FIG. 5 is a functional block diagram of the FIG. 4 embodiment, illustrating the inputs and outputs of a DAO control module used to implement the FIG. 3 embodiment, as described in connection with the embodiments illustrated in and described with respect to FIGS. 6 and 7.

In connection with a further explanation of at least two embodiments of the four channel flow ratio control system 32, the dual antisymmetric control module should be thought of as a block of the type shown in FIG. 5 having three inputs and two outputs. The three inputs are the flow ratio setpoint, $r_{sp}$, as the desired ratio of flow, predetermined by the user, $r_m$, the measured flow ratio as measured by the sensed output flow(s) from the flow sensors, and the optimal bias current $I_o$ to set the optimal bias current, which for a normally open valve is the minimum allowable valve current, and for a normally closed valve is a maximum allowable valve current for maintaining a valve fully open. The output currents $I_1$ and $I_2$ are the valve drive currents applied to the corresponding valves.

Figure 6:
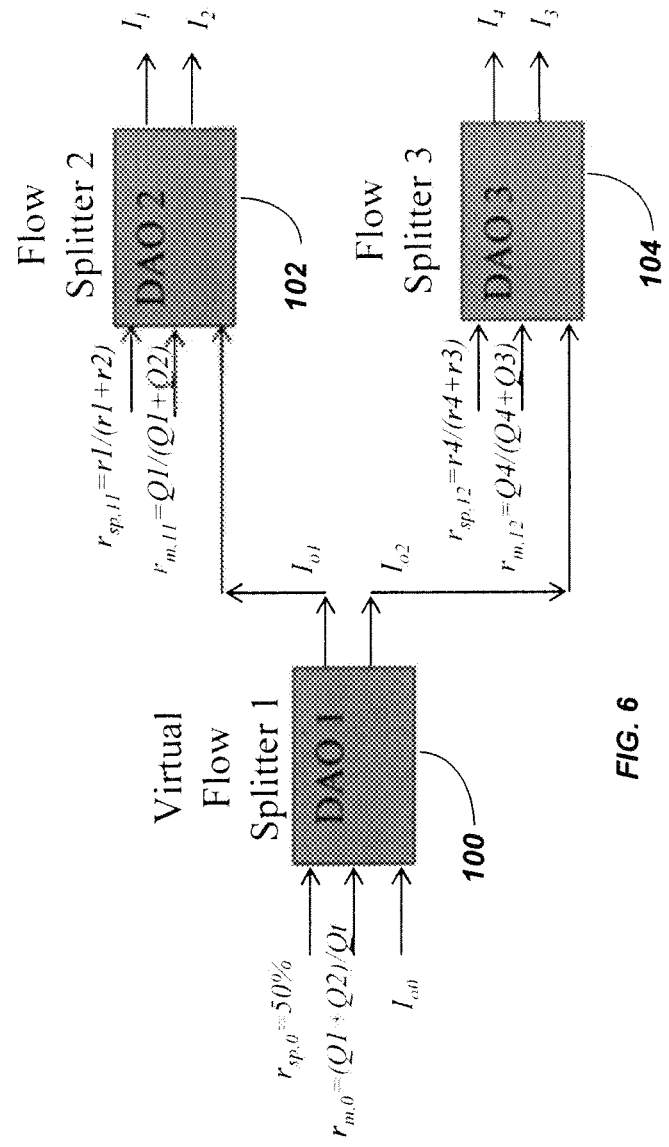
FIG. 6 is a functional block diagram of the FIG. 3 system illustrating one embodiment of resulting flow ratio control methods for the four secondary flow channels.
Figure 7:
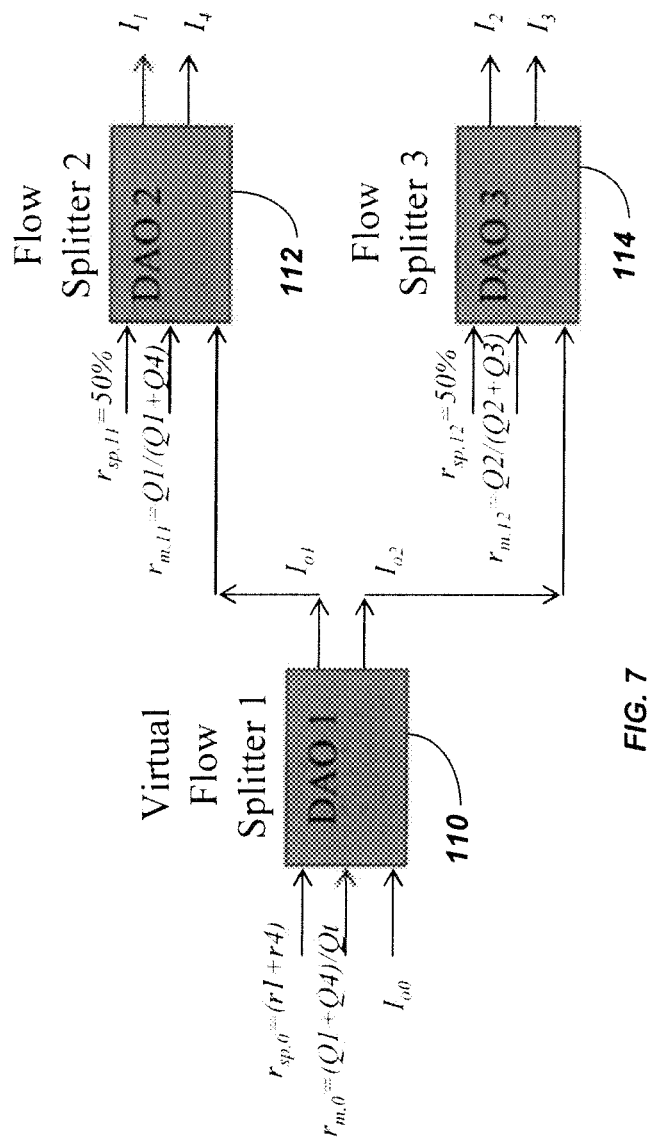
FIG. 7 is a functional block diagram of the FIG. 3 system illustrating a second embodiment of the resulting flow ratio control methods for the four secondary flow channels.

FIGS. 6 and 7 show two embodiments of the four channel flow ratio controller system configured in accordance with the teachings provided herein. In order to accomplish the flow ratio control in one stage, the embodiments of FIGS. 6 and 7 utilize three DAO modules of the type described in connection with FIGS. 4 and 5 so as to incorporate the advantages of dual antisymmetrical optimal control. The unit controller 36 is uniquely configured to include a dual antisymmetric optimal control algorithm (indicated by the virtual DAO module 100 in FIGS. 6 and 110 in FIG. 7) that is virtual, in the sense that there is no need for actual hardware. Instead two output currents $I_{o1}$ and $I_{o2}$ of the virtual DAO module are generated by the unit controller 36 as a function of (1) the user setting for the setpoint ratio $r_{sp,0}$ (2) the measured flow rates of two of the channels. e.g., the outputs from sensors 37-1 and 37-2 (of FIG. 3) provided to one of the fixtures relative to the total flow Qt (which is a function of the sum of all of the outputs of sensors 37-1, 37-2, 37-3 and 37-4); and (3) an optimal bias current $I_{oO}$, which as described is the minimum allowable valve current when utilizing normally opened valves, and of a maximum value when using normally closed valves. The values of the $I_{o1}$ and $I_{o2}$ are preferably determined in software operating in the unit controller 36. In this arrangement the two currents $I_{o1}$ and $I_{o2}$ provide the bias currents to the actual flow splitters indicated at 102 and 104 in FIGS. 6 and 112 and 114 in FIG. 7. One of these currents is the optimal bias current determined in accordance with the considerations provided above. The optimal bias current is applied to the actual flow splitter 102 or 104 in FIG. 6, and actual flow splitter 112 or 114 in FIG. 7, having the valve 58 or 60 with the lowest maximum flow when the valve is fully opened. If this valve is a normally opened valve this optimal bias current is zero, and if the valve is normally closed the optimal bias current is the maximum valve control current for that valve. As shown if FIG. 4, the bias currents $I_{o1}$ and $I_{o2}$ are applied to the summing junctions 48 and 52 of the respective DAO control module 42.

In the embodiment of FIG. 6, the four channel flow ratio controller system (illustrated at 32 in FIG. 3) evenly splits the flow between two chamber(s) and/or fixture(s) so that nominally 50% of the flow goes to each chamber/fixture and the ratio setpoint to the virtual flow splitter is hence $r_{sp,0}$=50%, and then splits each of those so that the ratio of the flow to the one portion of each fixture (e.g., the outer portion of a shower head fixture) relative to the total flow to the fixture is the same for each fixture. In general, the ratio setpoint to the virtual flow splitter is the summation of flow ratio setpoints of the first paired channels which is flowed to the first chamber/fixture, i.e.

$$r_{sp,0} = r_1 + r_2 \quad (4)$$

As shown in FIG. 6 the flow is split by flow splitter 102 as a function of (1) the set point ratio $r_{sp,11}$, which equals $r_1/(r_1+r_2)$; (2) the measured flow ratio (from flow sensors 62 and 64) $r_{m,11}$ which equals to $Q_1/Q_1+Q_2)$; and (3) the bias current $I_{o1}$ from the virtual flow splitter 100. Similarly, the flow is split by flow splitter 104 as a function of (1) the set point ratio $r_{sp,12}$, which equals $r_4/(r_3+r_4)$; (2) the measured flow ratio (from flow sensors 62 and 64 of that splitter) $r_{m,12}$ which equals to $Q_4/(Q_3+Q_4)$; and (3) the bias current $I_{o2}$ from the virtual flow splitter 100. The output of each of the actual flow splitters provides the appropriate drive currents $I_1$, $I_2$, hand $I_4$ for controlling the valves 58 and 60 of the respective pairs of valves.

A second embodiment illustrated in FIG. 7 is a four channel flow ratio controller unit (illustrated at 32 in FIG. 3) that includes virtual splitter 110 that splits the flow between the fixtures or chambers receiving flows in accordance with a ratio set point $r_{sp,0}$ that is set by the user. For example if flow is to be split between (a) the outer portions of two shower heads controlled for example by splitter 112 and (b) the inner portions of the two shower heads controlled by splitter 114, the two bias current outputs $I_{o1}$ and $I_{o2}$ is a function of (1) the input optimal bias current $I_{oO}$, (2) the set point $r_{sp,0}$, which equals the ratio of sum of the two ratios $r_1$ and $r_4$, and (3) the measured ratio $r_{mO}$ which equals the measured flow ratio $(Q_1+Q_4)/Q_t$. Since flow splitter 112 is to provide the same flow rate to same portions of the two fixtures or chambers, the output control currents $I_1$ and $I_4$ are a function of (1) the set point ratio $r_{sp,11}$ (which is set for 50%), (2) the measured ratio $r_{m,11}$, which equals the measured flow ratio of $Q_1/(Q_1+Q_4)$, and (3) the bias current output $I_{o1}$ from the virtual flow splitter 110. Similarly, since flow splitter 114 is to provide the same flow rate to same portions of the two fixtures or chambers, the output control currents $I_2$ and $I_3$ are a function of (1) the set point ratio $r_{sp,12}$ (which is set for 50%), (2) the measured ratio $r_{m,12}$, which equals the measured flow ratio of $Q_2/(Q_2+Q_3)$, and (3) the bias current output $I_{o2}$ from the virtual flow splitter 110. The output of each of the actual flow splitters provides the appropriate drive currents $I_1$, $I_2$, $I_3$ and $I_4$ for controlling the valves 58 and 60 of the respective pairs of valves.

Again it is noted that the actual flow to each portion of each fixture is adjusted to take into account variations in the flow conditions and component parts along each flow path. Thus, in the example described above the flow might actually be more than 50% of the total flow to the outer portion of one fixture when compared to the flow to the outer portion of the other fixture, and the divided flow by the two flow splitters for each fixture may be different, to take into account these variations. In general, the flow ratio setpoint to the flow splitter 112 in FIG. 7 is the relative ratio between the flow ratio setpoints in the first paired flow channels, i.e.

$$r_{sp,11}=r_1/(r_1+r_4) \quad (5)$$

and the flow ratio setpoint to the flow splitter 114 is the relative ratio between the flow ratio setpoints in the second paired flow channels, i.e.

$$r_{sp,12}=r_2/(r_2+r_3) \quad (6)$$

Again the arrangements in FIG. 6 and FIG. 7 take advantages of dual antisymmetrical optimal control, with the unit controller 36 being configured to run three dual antisymmetric optimal control modules (indicated by one virtual flow splitter 100 in FIG. 6 or 110 in FIG. 7, and two actual flow splitters 102 and 104 in FIG. 6 or 112 and 114 in FIG. 7). The virtual flow splitter 100 or 110 has the similar function of the upstream flow splitter 10A in FIG. 1 but it is virtual, in the sense that there is no need for actual hardware as compared to 10A in FIG. 1. Instead two output currents $I_{o1}$ and $I_{o2}$ of the virtual DAO module 100 or 110 are generated by the unit controller 36 as a function of (1) the user setting for the setpoint ratio $r_{sp,0}$; (2) the measured flow ratios of corresponding channels; and (3) an optimal bias current $I_{o0}$, which as described is zero when utilizing normally opened valves, and of a maximum value when using normally closed valves. The values of the $I_{o1}$ and $I_{o2}$ can thus be determined by the DAO algorithm in the unit controller 36. In this arrangement the two output currents $I_{o1}$ and $I_{o2}$ from the virtual DAO module provide the bias currents to the actual flow splitters 102 and 104 in FIG. 6 or 112 and 114 in FIG. 7. One of these currents is the optimal bias current determined in accordance with the considerations provided above. The optimal bias current is applied to the flow splitter 102 or 104 in FIG. 6, or 112 or 114 in FIG. 7 having the valve 58 or 60 with the maximum allowable conductance when the valve is fully opened. If this valve is a normally opened valve this optimal bias current is zero, and if the valve is normally closed the optimal bias current is the maximum valve control current. As shown if FIG. 4, the bias currents $I_{o1}$ and $I_{o2}$ are applied to the summing junctions 48 and 52 of the respective DAO control module 42. Thus, in each of the FIGS. 6 and 7, the outputs of all SISO controllers in the DAO arrangement are split and modified before being applied to the valves of each unit. The valve control commands applied to the one flow splitter (in FIG. 6 flow splitter 102 or 104, and in FIG. 7 flow splitter 112 or 114) are virtually antisymmetric with respect to the valve control commands applied to the other. Due to the fact that these two valve commands are passing through respective linear saturators with the maximum allowable valve conductance position as one of the two saturation limits, the net effect is that two valves of one of the units is kept at the maximum allowable valve conduction position at any moment of time while the other is actively controlled to maintain the virtual flow ratio. Therefore, the antisymmetric optimal control algorithm gives a maximum allowable total valve conductance at any moment. As discussed above, the maximum total valve conductance will give a fast settling time for ratio, flows and upstream pressure, and low pressure drop across the flow ratio controller. Thus, the antisymmetric optimal control algorithm greatly improves the control performance of the flow ratio controller.

It is noted that while the embodiments have been described as four channel gas delivery systems, the principles described herein apply to any multi-channel gas delivery system employing at least two DAO control modules.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents.

Nothing which has been stated or illustrated is intended or should be interpreted to cause a dedication of any component, step, feature, object, benefit, advantage, or equivalent to the public, regardless of whether it is recited in the claims.

The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents.

What is claimed is:
1. A four channel gas delivery system comprising:
an inlet channel;
four outlet channels;
four control valves, each valve being arranged so as to control a flow from the inlet channel through a corresponding one of the outlet channels;

a flow ratio control system configured so as to control the flow from the inlet channel through the corresponding outlet channels so that the following flow ratios are controlled:

(a) a first ratio of flows between the outlet channels of a first pair;

(b) a second ratio of flows between the outlet channels of a second pair; and (c) a third ratio of flows between the first pair of outlet channels relative to the second pair of outlet channels;

wherein the third ratio is controlled by generating at least one bias signal respectively applied to at least one pair of valves, the bias signal being a function of a predetermined set point of the third ratio and measured values of the third ratio.

2. The four channel gas delivery system of claim 1, further including four flow sensors arranged to the sense the flows through the corresponding four outlet channels, wherein the measured values of all three flow ratios are functions of the flows sensed through the flow sensors.

3. The four channel gas delivery system of claim 2, wherein the flow ratio control system includes antisymmetric feedback control arrangements configured to control the flows between the first pair of outlet channels relative to the second pair of outlet channels as a function of the third ratio set point.

4. The four channel gas delivery system of claim 1, wherein the flow ratio control system includes a dual antisymmetric optimal control module including a feedback control arrangement for controlling the third ratio of flows between the first pair of outlet channels relative to the second pair of outlet channels so as to maintain the measured third ratio equal to a predetermined set point.

5. The four channel gas delivery system of claim 4, wherein the dual antisymmetric optimal control module is implemented in software.

6. The four channel gas delivery system of claim 1, wherein a set point of the third ratio is the summation of flow ratio setpoints on the first paired flow channels.

7. The four channel gas delivery system of claim 1, wherein the set point of each of the first and second ratios are the relative ratio between the flow ratio setpoints in the paired flow channels.

8. The four channel gas delivery system of claim 1, further including four flow meters arranged to measure flow through the corresponding outlet channels and for providing a flow measurement signal representative of the measured flow through each outlet channel, wherein each valve is responsive to at least one of the flow measurement signals.

9. The four channel gas delivery system of claim 8, wherein measured values of all three ratios are determined as a function of the flow measurement signals associated with the four outlet channels.

10. The four channel gas delivery system of claim 1, wherein the flow ratio control system includes a controller configured to provide antisymmetric optimal control of the mass flow through the outlet channels so as to maintain the first, second and third ratios of flow through the outlet channels.

11. The four channel gas delivery system of claim 10, wherein the controller further includes three dual antisymmetric optimal (DAO) control modules for generating a valve control signal for each of the valves, wherein each of the valves is responsive to a corresponding valve control signal.

12. The four channel gas delivery system of claim 11, wherein the bias signal is added to the valve control signals applied to the at least one pair of valves.

13. The four channel gas delivery system of claim 12, wherein a second bias signal is added to the valve control signals applied of the other pair of valves.

14. The four channel gas delivery system of claim 13, wherein one of the bias signals is the optimal bias for maintaining at least one of the valves in a maximum allowable opened position.

15. The four channel gas delivery system of claim 14, were the valves are normally opened valves and the one bias signal is minimum allowable valve current.

16. The four channel gas delivery system of claim 14, wherein the valves are normally closed valves and the one bias signal is the maximum allowable valve current required to keep the valve at the maximum allowable open position.

17. The four channel gas delivery system of claim 1, wherein the flow ratio control system includes two dual antisymmetric optimal (DAO) control modules configured and arranged so as to control the relative ratios of flow from the inlet channel through the four outlet channels, and a virtual DAO control module configured and arranged so as to control the ratio of flow between the two DAO control modules.

18. The four channel gas delivery system of claim 17, wherein the virtual DAO control module is configured and arranged so to determine a bias current for each of the DAO control modules as a function of the ratio of flow between the two DAO control modules.

19. The four channel gas delivery system of claim 17, wherein a ratio set point of the virtual DAO control module is nominally set at 50%.

20. The four channel gas delivery system of claim 19, wherein the ratio set point of one of the DAO control modules is set for $r1/(r1+r2)$, wherein $r1$ and $r2$ are the ratio of flows through the corresponding outlet channels of the one DAO control module relative to the total flow.

21. The four channel gas delivery system of claim 19, wherein the ratio set point of the other of the DAO control modules is set for $r4/(r3+r4)$, wherein $r3$ and $r4$ are the ratio of flows through the corresponding outlet channels of the other DAO control module relative to the total flow.

22. The four channel gas delivery system of claim 17, wherein a ratio set point of the virtual DAO control module is set for $r1+r4$, wherein $r1$ and $r4$ are the ratio of flows through the corresponding outlet channels of the one DAO control module relative to the total flow.

23. The four channel gas delivery system of claim 22, wherein the ratio set point of one of the DAO control modules is set nominally for 50% so that the flow rates through the outlet channels of the one DAO control module is nominally the same.

24. The four channel gas delivery system of claim 22, wherein the ratio set point of the other of the DAO control modules is set nominally for 50% so that the flow rates through the outlet channels of the one DAO control module is nominally the same.

25. The four channel gas delivery system of claim 17, wherein a ratio set point of the virtual DAO control module is the summation of flow ratio setpoints on first paired flow channels.

26. The four channel gas delivery system of claim 25, wherein the ratio set point of one of the DAO control modules is the relative ratio between the flow ratio setpoints in the first paired flow channels.

27. The four channel gas delivery system of claim 25, wherein the ratio set point of the other of the DAO control modules is the relative ratio between the flow ratio setpoints in the second paired flow channels.

28. A four channel gas delivery system comprising:
an inlet channel;
four outlet channels;
four control valves, each valve being arranged so as to control a flow from the inlet channel through a corresponding one of the outlet channels;
a flow ratio control system including two dual antisymmetric optimal (DAO) control modules configured and arranged so as to control the respective control valves so as to control the relative ratios of flow from the inlet channel through the four outlet channels, and a virtual DAO control module configured and arranged so as to control the ratio of flow between the two DAO control modules; wherein a ratio set point of the virtual DAO control module is nominally set at 50%; and
wherein the ratio set point of one of the DAO control modules is set for $r1/(r1+r2)$, wherein $r1$ and $r2$ are the ratio of flows through the corresponding outlet channels of the one DAO control module relative to the total flow.

29. The four channel gas delivery system of claim 28, wherein the virtual DAO control module is configured and arranged so to determine a bias current for each of the DAO control modules as a function of the ratio of flow between the two DAO control modules.

30. The four channel gas delivery system of claim 28, wherein the virtual DAO control module provides a bias current to each of the DAO control modules as a function of the ratio of flow between the two DAO control modules, and each of the DAO control modules provides a pair of bias currents to two of the control valves used to control the flow rates through two corresponding outlet channels.

31. A four channel gas delivery system comprising:
an inlet channel;
four outlet channels;
four control valves, each valve being arranged so as to control a flow from the inlet channel through a corresponding one of the outlet channels;
a flow ratio control system including two dual antisymmetric optimal (DAO) control modules configured and arranged so as to control the respective control valves so as to control the relative ratios of flow from the inlet channel through the four outlet channels, and a virtual DAO control module configured and arranged so as to control the ratio of flow between the two DAO control modules; wherein a ratio set point of the virtual DAO control module is nominally set at 50%; and
wherein the ratio set point of the other of the DAO control modules is set for $r4/(r3+r4)$, wherein $r3$ and $r4$ are the ratio of flows through the corresponding outlet channels of the other DAO control module relative to the total flow.

32. The four channel gas delivery system of claim 31, wherein the virtual DAO control module is configured and arranged so to determine a bias current for each of the DAO control modules as a function of the ratio of flow between the two DAO control modules.

33. The four channel gas delivery system of claim 31, wherein the virtual DAO control module provides a bias current to each of the DAO control modules as a function of the ratio of flow between the two DAO control modules, and each of the DAO control modules provides a pair of bias currents to two of the control valves used to control the flow rates through two corresponding outlet channels.

34. A four channel gas delivery system comprising:
an inlet channel;
four outlet channels;
four control valves, each valve being arranged so as to control a flow from the inlet channel through a corresponding one of the outlet channels;
a flow ratio control system including two dual antisymmetric optimal (DAO) control modules configured and arranged so as to control the respective control valves so as to control the relative ratios of flow from the inlet channel through the four outlet channels, and a virtual DAO control module configured and arranged so as to control the ratio of flow between the two DAO control modules; and
wherein a ratio set point of the virtual DAO control module is set for $r1+r4$, wherein $r1$ and $r4$ are the ratio of flows through the corresponding outlet channels of the one DAO control module relative to the total flow.

35. The four channel gas delivery system of claim 34, wherein the ratio set point of one of the DAO control modules is set nominally for 50% so that the flow rates through the outlet channels of the one DAO control module is nominally the same.

36. The four channel gas delivery system of claim 34, wherein the ratio set point of the other of the DAO control modules is set nominally for 50% so that the flow rates through the outlet channels of the other DAO control module is nominally the same.

37. The four channel gas delivery system of claim 34, wherein the ratio set point of the virtual DAO control module is the summation of the flow ratio setpoints on first paired flow channels.

38. The four channel gas delivery system of claim 37, wherein the ratio set point of one of the DAO control modules is the relative ratio between the flow ratio setpoints in the first paired flow channels.

39. The four channel gas delivery system of claim 37, wherein the ratio set point of the other of the DAO control modules is the relative ratio between the flow ratio setpoints in the second paired flow channels.

40. The four channel gas delivery system of claim 34, wherein the virtual DAO control module is configured and arranged so to determine a bias current for each of the DAO control modules as a function of the ratio of flow between the two DAO control modules.

41. The four channel gas delivery system of claim 34, wherein the virtual DAO control module provides a bias current to each of the DAO control modules as a function of the ratio of flow between the two DAO control modules, and each of the DAO control modules provides a pair of bias currents to two of the control valves used to control the flow rates through two corresponding outlet channels.

42. A multi-channel gas delivery system for controlling a flow from an inlet channel through four outlet channels, comprising:
a flow ratio control system including two dual antisymmetric optimal (DAO) control modules configured and arranged so as to control the relative ratios of flow from the inlet channel through the four outlet channels, and a signal generator configured and arranged so as generate a control signal for each of the two DAO control modules as a function of the ratio of flow through the two DAO control modules;
wherein a ratio set point of the control signal generator module is nominally set at 50%;
wherein the ratio set point of one of the DAO control modules is set for $r1/(r1+r2)$, wherein $r1$ and $r2$ are the ratio of flows through the corresponding outlet channels of the one DAO control module relative to the total flow.

43. The multi-channel gas delivery system of claim 42, wherein the flow through each outlet channel is controlled by a control valve in response to a valve drive signal and the corresponding control signal is added to drive currents generated by each DAO control module.

44. A multi-channel gas delivery system for controlling a flow from an inlet channel through four outlet channels, comprising:
   a flow ratio control system including two dual antisymmetric optimal (DAO) control modules configured and arranged so as to control the relative ratios of flow from the inlet channel through the four outlet channels, and a signal generator configured and arranged so as generate a control signal for each of the two DAO control modules as a function of the ratio of flow through the two DAO control modules;
   wherein a ratio set point of the control signal generator module is nominally set at 50%; and
   wherein the ratio set point of the other of the DAO control modules is set for r4/(r3+r4), wherein r3 and r4 are the ratio of flows through the corresponding outlet channels of the other DAO control module relative to the total flow.

45. The multi-channel gas delivery system of claim 44, wherein the flow through each outlet channel is controlled by a control valve in response to a valve drive signal and the corresponding control signal is added to drive currents generated by each DAO control module.

46. A multi-channel gas delivery system for controlling the a flow from an inlet channel through four outlet channels, comprising:
   a flow ratio control system including two dual antisymmetric optimal (DAO) control modules configured and arranged so as to control the relative ratios of flow from the inlet channel through the four outlet channels, and a signal generator configured and arranged so as generate a control signal for each of the two DAO control modules as a function of the ratio of flow through the two DAO control modules;
   wherein the control signal generator generates the control signal as a function of the a ratio setpoint of the ratio of flows through the two outlet channels of the respective DAO control module, the measured ratio of flows through the two outlet channels of the respective DAO control module and an optimal bias current; and
   wherein the ratio set point of the control signal generator is set for r1+r4, wherein r1 and r4 are the ratio of flows through the corresponding outlet channels of the one DAO control module relative to the total flow.

47. The multi-channel gas delivery system of claim 46, wherein the ratio set point of one of the DAO control modules is set nominally for 50% so that the flow rates through the outlet channels of the one DAO control module is nominally the same.

48. The multi-channel gas delivery system of claim 46, wherein the ratio set point of the other of the DAO control modules is set nominally for 50% so that the flow rates through the outlet channels of the one DAO control module is nominally the same.

49. The four channel gas delivery system of claim 46, wherein the ratio set point of the control signal generator is the summation of the flow ratio setpoints on first paired flow channels.

50. The four channel gas delivery system of claim 49, wherein the ratio set point of one of the DAO control modules is the relative ratio between the flow ratio setpoints in the first paired flow channels.

51. The four channel gas delivery system of claim 49, wherein the ratio set point of the other of the DAO control modules is the relative ratio between the flow ratio setpoints in the second paired flow channels.

52. The multi-channel gas delivery system of claim 46, wherein the flow through each outlet channel is controlled by a control valve in response to a valve drive signal and the corresponding control signal is added to drive currents generated by each DAO control module.

* * * * *